United States Patent [19]
Coteus et al.

[11] Patent Number: 5,558,523
[45] Date of Patent: Sep. 24, 1996

[54] PAD ON PAD TYPE CONTACT INTERCONNECTION TECHNOLOGY FOR ELECTRONIC APPARATUS

[75] Inventors: Paul W. Coteus, Yorktown Heights; Alphonso P. Lanzetta, Marlboro, both of N.Y.

[73] Assignee: International Business Machines Corporation, Armonk, N.Y.

[21] Appl. No.: 275,897

[22] Filed: Jul. 15, 1994

[51] Int. Cl.⁶ ................................................. H01R 23/66
[52] U.S. Cl. ..................................... 439/67; 439/493
[58] Field of Search .................................. 439/67, 493

[56] References Cited

U.S. PATENT DOCUMENTS

| | | | |
|---|---|---|---|
| 3,963,315 | 6/1976 | Bonis | 439/72 |
| 4,169,641 | 10/1979 | Olsson | 439/493 |
| 4,252,389 | 2/1981 | Olsson | 439/493 |
| 4,509,098 | 4/1985 | Das Gupta et al. | 361/398 |
| 4,509,099 | 4/1985 | Takamatsu et al. | 361/413 |
| 4,740,867 | 4/1988 | Roberts et al. | 361/398 |
| 4,948,374 | 8/1990 | Carter | 439/67 |

FOREIGN PATENT DOCUMENTS 209786  8/1989  Japan ................................. 439/67

OTHER PUBLICATIONS

Wanek, D. J.–Research Disclosure, Apr. 1990, No. 312 RO 888–0349–Flex Cable Solderless Connector.
IBM Tech Disc. Bulletin vol. 18 No. 11 Apr. 1976 P3588 Ward, W. C.–Solderless Module to Circuit Connection.

Primary Examiner—Gary F. Paumen
Attorney, Agent, or Firm—Daniel P. Morris; Alvin J. Riddles

[57] ABSTRACT

A pad on pad type contact, and technology therefor, for electronic apparatus wherein a spring member, that by its shape and material in the motion when the contact comes together wipes the mating pad surfaces across each other and then retains them under permanent compressive force in service. In high density and high performance electronic apparatus interwiring, array quantities of the spring member of contact are fabricated in unitary assembly elements for connection assemblies between both rigid and flexible type wiring.

7 Claims, 3 Drawing Sheets

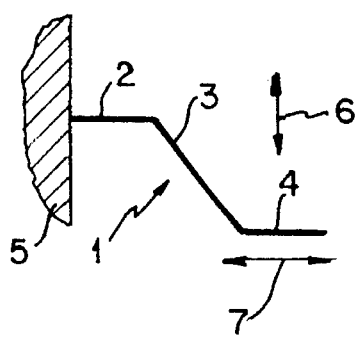
FIG. 1
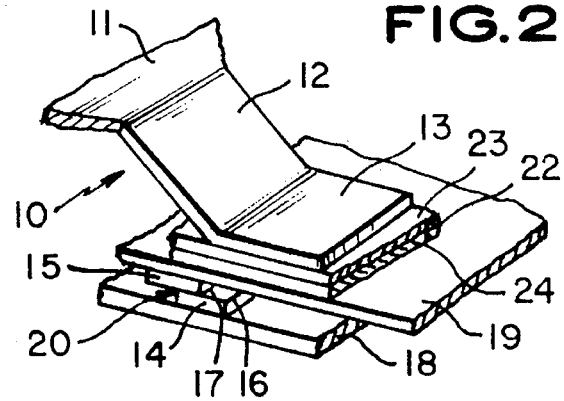
FIG. 2
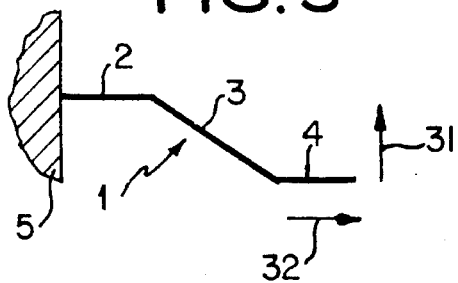
FIG. 3
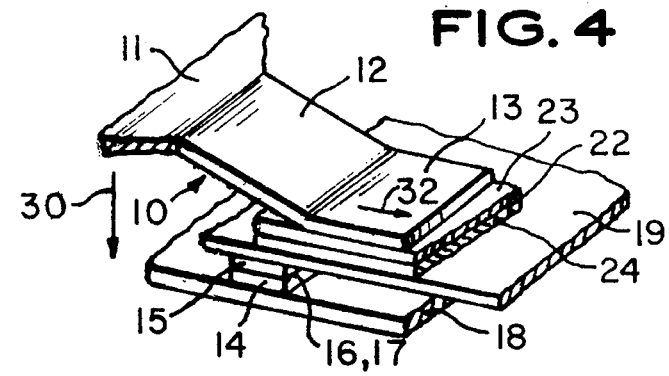
FIG. 4
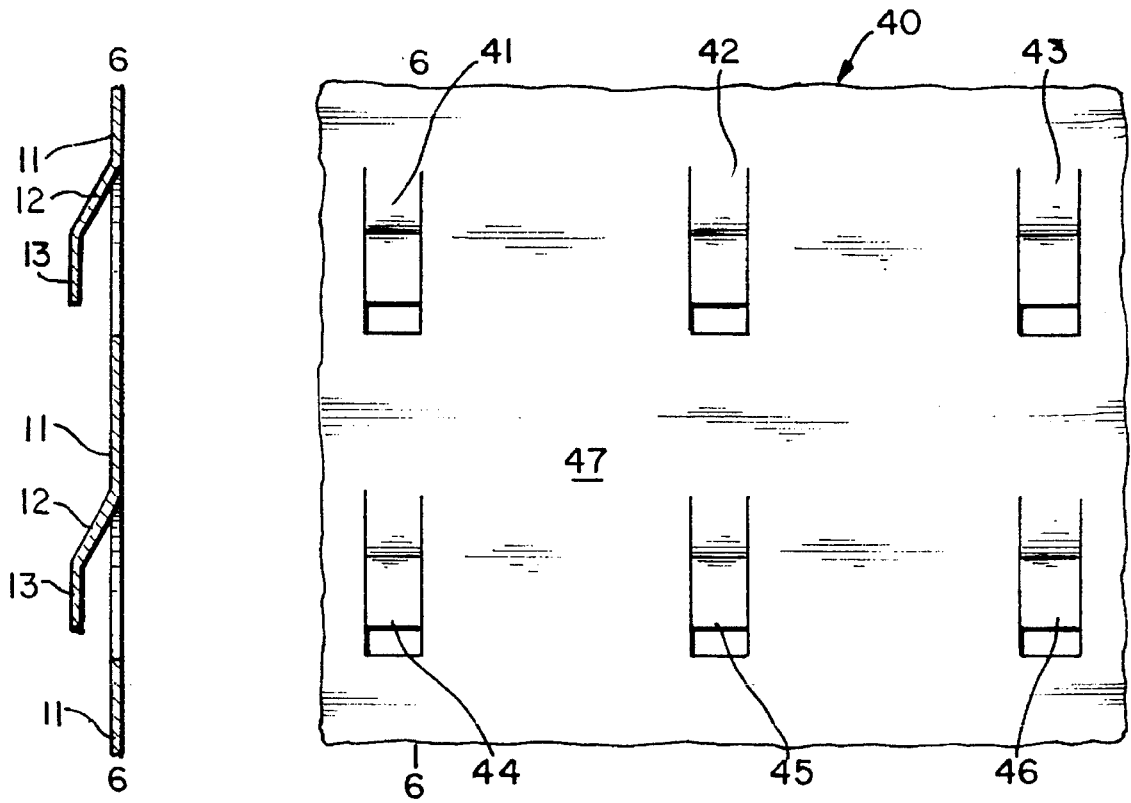
FIG. 6
FIG. 5

PAD ON PAD TYPE CONTACT INTERCONNECTION TECHNOLOGY FOR ELECTRONIC APPARATUS

FIELD OF THE INVENTION

The invention relates to the interconnection of devices and arrays of devices in electronic apparatus and in particular to the technology of interconnections employing the pad on pad type of contact and to the pad on pad type of contact to the "flex tape" type of electronic apparatus wiring.

BACKGROUND AND RELATION TO THE PRIOR ART

As the performance, density and cost considerations of electronic apparatus become more stringent the structure is evolving into a tightly packed arrangement of interconnected device bearing boards with a large quantity of very closely positioned contacts. Those contacts cannot be permitted to introduce impedance into the interconnecting system and the conductors, in turn, in the interconnecting system cannot be permitted to introduce an impedance limitation on the transmission of the signals. Further, the large numbers of contacts must be such that they can be fabricated without introducing non-uniformity and reliability problems as is the situation where meticulous care is not taken to prevent metal oxides, grease, corrosion, insulating material particles and other debris from getting between the mating surfaces.

One contacting technique receiving attention in the art involves a pad on one member contacting a pad on another member with the pads being held in position in service by a structure that supplies approximately constant pressure. The technique is known in the art by the terminology "pad on pad". In high density electronic apparatus there is very little space to accommodate structure associated with contacts. The pad on pad type contact occupies a small area.

In the pad on pad type of contacting, reliability, uniformity and impedance minimization is greatly improved where a wiping operation of one pad on the other can be supplied when the pads are brought together. Heretofore in the art however, the providing of constant pressure in service and the providing of a wiping operation introduce considerable added structure in an interconnecting system. In many applications there just isn't room for any added structure.

One type of electronic apparatus wiring employs a dielectric supporting member with flexible conductors on or embedded in it. It is known in the art as "flex tape". In the "flex tape" the dielectric supported wiring conductors are available with precision electric transmission line properties and with ground planes where desired. The flexibility simplifies large array assembly. The wiring benefits of "flex tape" wiring in electronic apparatus are somewhat offset by the difficulty and added structure needed for connection to "flex tape" and between "flex tapes".

One example of that added structure in applying constant pressure in service is shown in U.S. Pat. No. 4,948,374 wherein pads on a "flex tape" are retained in contact with pads on a printed circuit board in a housing that has a bow spring and a deformable pad urging the pads together.

Pad on pad connections to "flex tape" conductors where there is also wiping of the pads as they are assembled has heretofore in the art been confined to structures where the "flex tape" conductors are supported by a rigid supporting member.

As an example, in U.S. Pat. No. 4,740,867 a connecting structure is shown where the "flex tape" is clamped in a slotted housing and a rigid connector member enters the slot, wipes and makes contact with the flex tape conductors.

There is a need in the art for the ability to make reliable, uniform, and low cost, pad on pad connections, to all types of substrates, both rigid and flexible, without complex associated structure.

SUMMARY OF THE INVENTION

A pad on pad type of contact technology is provided wherein each pad on pad contact combination wipes one pad with respect to the other as the contact comes together and the combination is held in place under permanent compression in service. The contact of the invention has a spring member that has, serially, a support portion, an elongated spring portion that is at an angle to the direction of the support portion, and a compression portion that is about the size of, and essentially parallel to, the surfaces of the pads. There is a friction relationship between the compression portion and the substrate supporting one of the pads. The stress in the motion bringing the pads together, changes the angle the elongated spring portion makes with the support portion causing the compression portion of the spring member to move in a direction parallel to the pad surfaces because of the fixed length of the elongated spring portion which in turn moves one pad surface with respect to the other in a wiping motion; and then in service the mated pads are retained in contact under permanent compression by the spring properties under deflection in the spring portion of the spring member. The technology permits high density spring arrays of contacts with spring members being formed as part of a common sheet. The technology also permits high density high performance contacting between flexible substrates which in turn permits "flex tape" interwiring throughout extensive electronic apparatus.

BRIEF DESCRIPTION OF THE DRAWINGS

FIG. 1 is a line representation of the relative relationship of the portions of the spring member of the pad on pad contact of the invention.

FIG. 2 is a schematic perspective view of the pad on pad contact of the invention in the open condition.

FIG. 3 is a line representation of the relative relationship of the portions of the spring member of the pad on pad contact of the invention in the closed condition.

FIG. 4 is a schematic perspective view of the pad on pad contact of the invention in the closed condition.

FIGS. 5 and 6 are top and side section views respectively of a portion of an array of the spring members of the pad on pad contact of the invention.

DESCRIPTION OF THE INVENTION

Figure 7:
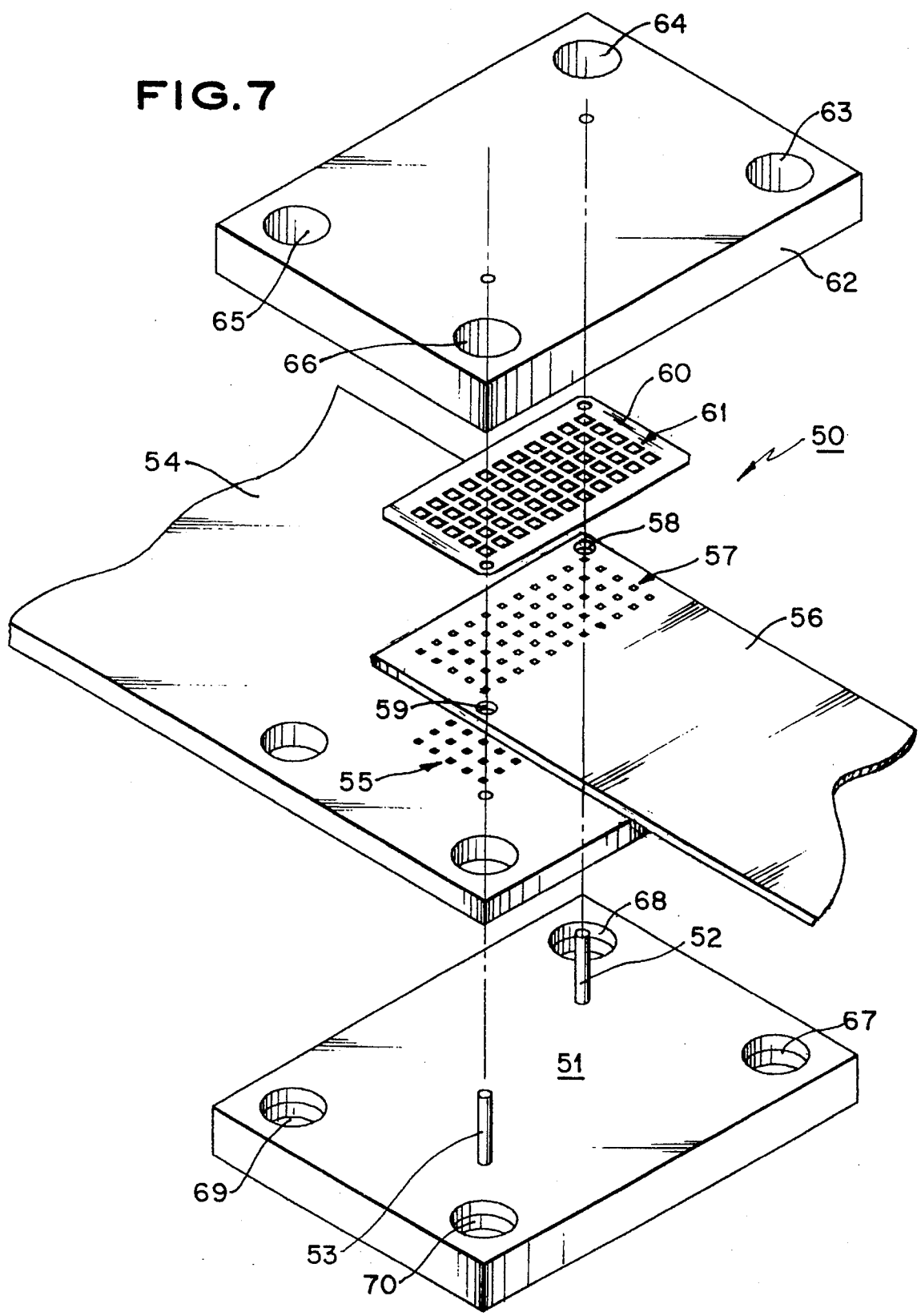
FIG. 7, is a schematic perspective view of a connector assembly showing the elements as they are positioned in a pad on pad contact array assembly.

In connecting large numbers of contacts in arrays and in particular where at least one of the substrates supporting at least one of the contacts is flexible, a contact technology is provided through the invention where each electrically contacting portion of the contact is a pad, and the mating surfaces of the pad pairs of each contact are caused to wipe across those mating surfaces by the construction of the parts of a spring member that also then provides a permanent compressive force across those mating surfaces in service. The wiping operation dislodges any debris or corrosion that if not removed may introduce impedance, unreliability and/ or non uniformity to the contacts. The spring members may be made of a material selected only for spring properties. The spring members in arrays may be made out of a single sheet of material in a simple stamping operation into a single array size pressure plate assembly component.

Referring to FIG. 1 there is shown a line representation of the relative relationship of the portions of the spring member of the pad on pad contact of the invention. The spring member 1 has, in serial relationship, a support portion 2, a spring portion 3, shaped to be at an angle to the direction of the support portion 2 and a compression portion 3, shaped to be essentially in the direction of the support portion 2 and the size of the pads in the contact. The support portion 2 is fixed with respect to motion in the plane of portion 2 by support such as element 5 as symbolically illustrated, or by being part of a larger object. The spring portion 3 has one end connected to the support portion 2, has a fixed length and is shaped to be at an angle to the plane of support portion 2. The compression portion 4 is attached to the remaining end of the spring portion 3 and is shaped to be essentially parallel to the plane of the support portion 2. In service, relative motion as depicted by the bidirectional arrow 6, essentially perpendicular to the plane of support portion 2 and compression portion 4, because of the fixed length of the spring portion 3, will result in a displacement, as shown by the bidirectional arrow 7, of the compression portion 4.

Referring to FIG. 2 there is shown a perspective view of the pad on pad contact of the invention with the contact in the open or unconnected position. The spring member 10 of the contact, is made up as discussed in connection with FIG. 1; of a planar support portion 11, which may be a portion of a larger array member; a spring portion 12, with one end attached to the portion 11 and shaped to be at an angle to the plane of portion 11; and, a compression portion 13 attached to the remaining end of the spring portion 12 and shaped to be essentially parallel to the plane of the support portion 11. The compression portion 13 in service will provide constant compressive force on the pad 14 on pad 15 contact assembly and will provide wiping motion across the contacting surfaces 16 and 17 when the pads 14 and 15 are brought into contact with each other. The pads 14 and 15 are each an electrical contact or a portion of a conductor on substrates 18 and 19 respectively such as a semiconductor component, a printed circuit board, or a "flex tape".

The pads 14 and 15 in FIG. 2 are shown with a separation 20 between them. The compression portion 13 of the spring member 10 is provided with a friction capability to facilitate the physical wiping movement of the pad surfaces 16 and 17 as they are brought together in the contact. The friction capability is shown as an adhesive member 22 which operates to urge the substrate 19 to move with the compression member 13 and in turn to move the surface 17 across the surface 16 as the pads 14 and 15 come together. The member 22 is shown having multiple layers such as a double sided 23 and 24 adhesive film each side with properties related to adhesion to the type of material it contacts. Where convenient the adhesive capability could also cover the entire surface of the substrate 19 or alternatively the entire surface of the spring array. Element 23 would contact the metal of portion 13 of spring member 10 whereas element 24 would contact the dielectric backing of the substrate 19.

Referring next; to FIG. 3, using the same reference numerals as in FIG. 1 where appropriate, there is shown a line representation of the portions of the spring member 1 when the pad on pad contact is in the closed or contacting position; together with FIG. 4, which is a perspective view of the pad on pad contact in the closed or contacting position and where, the same reference numerals as in FIG. 2 where appropriate are used. Contact closing motion shown by the arrow 30 in FIG. 4 operates to produce vertical displacement as shown by the arrow 31 of FIG. 3 of the compression portion 4 which, in turn because it is attached through spring portion 3 and then support portion 2, results in a change in the angle the spring portion 3 makes with the support portion 2 and produces a displacement of the compression portion 4 as shown by the arrow 32. The displacement is labelled 32 in FIG. 4 and operates to move the compression portion 13 which motion is translated through the adhesive member 22 to the substrate 19 thereby providing relative wiping motion of the contact surfaces 16 and 17 of the contacts 14 and 15 as they come together. The spring deflection properties of the spring portion 12 in FIG. 4 then provide permanent compressive force across the pads 14 and 15 contact combination while they are in service.

There are a number of unique features and benefits derived therefrom that are associated with the contact and technology of the invention.

The spring member 1 does not have to carry current and consequently the properties of the material used does not have to be subject to resistivity, corrosion, metal migration or any other similar considerations of a current carrying contact. Freedom from resistivity considerations, in turn, permits a wider range of available materials with predictable and durable spring properties. The spring member 10 may be of a material such as spring steel. The substrates 18 and 19 may be rigid such as printed circuit board or even semiconductor material or they may be flexible such as "flex tape". Where all substrates are flexible, a rigid backing member, not shown, would be provided under element 18. Registration for assembly would be provided by dowels or equivalent, not shown. A clearance of less than the width of a pad, for the displacement 32, would be provided at the dowel openings in the substrate 19. It should be noted that registration between the substrate 18 and the spring array 40 must be established and maintained. Appropriate alignment is achieved and maintained through use of a friction capability.

The friction capability can be provided by the adhesive member 22 which may be of a frictional, pressure sensitive, or permanent type interface, or it can be provided by an element such as a ridge or protrusion on the side of the substrate 19 next to the compression member 13. It is essential only that as the compression portion 13 is displaced, it moves the substrate 19 along with it. The spring members 10, in array increments, may be stamped from a single piece into a spring array assembly component. Alternatively, small arrays may be grouped into larger arrays to improve registration and reduce die types.

In FIGS. 5 and 6, top and side section views, respectively are shown of a portion of an array of spring members in a single piece. Referring to FIGS. 5 and 6 a single sheet piece of spring steel 40 has a plurality of spring members of which elements 41–46 are shown as an example and where the support portion 11 is part of the common portion 47 of the sheet 40 with the spring portion 12 and the compression portion 13 being formed displaced from the plane of the sheet. In the section view of FIG. 6 the portions are labelled with the reference numerals of FIGS. 2 and 4, with each spring portion angularly attached to the common support portion and each compression portion offset from but essentially parallel to the common support portion. For dimensional perspective, contact spring members such as elements 41–46 can be stamped to spacings as small as die manufacturing can achieve which at the present time is approximately a 1.27 mm center to center dimension. The compression portion 13 corresponds to the size of a pad which is an about 0.127 by 0.254 millimeter (mm) rectangle.

Referring to FIG. 7 a perspective schematic view of the connector assembly is shown of the elements of the pad on pad technology of the invention as they are assembled. In the connector assembly 50 there is a rigid supporting base member 51 having registration dowels 52 and 53 extending vertically therefrom. A first substrate 54, corresponding to substrate 18 in FIGS. 2 and 4, is positioned over the dowels 52 and 53 and in contact with the base member 51 with the pad contact array 55 on the side that is away from the support member 51. A second substrate 56, corresponding to the substrate 19 of FIGS. 2 and 4 is next positioned over the dowels 52 and 53, with the pad contact array 57 in contact with the pad contact array 55. In the assembly of FIG. 7 the pad contact array 57 is on the underside of the substrate 56 and would not be directly visible so that only the outline of the location of the contacts is shown as array 57 in the upper surface. The openings 58 and 59 for dowels 52 and 53 respectively are elongated about half a pad width to accommodate the displacement of the substrate 56 when the pad surfaces in arrays 55 and 57 wipe across each other. Adjacent substrates 54 and 56 enter the assembly 50 from opposite sides.

A punch and die fabricated spring array assembly component 60 is positioned with the dowels 52 and 53 passing through registration holes therein. The spring array assembly component 60 has an array 61 of contact spring members for each pad combination in arrays 55 and 57. The spring array assembly component 60 is a structure with spring member features corresponding to element 40 of FIG. 5 and is positioned with the side having the spring members in contact with the substrate 56. While the substrate 54 is shown as being rigid and the substrate 56 is shown as being a "flex tape" or both, as desired.

A rigid upper member 62 is positioned over the dowels 52 and 53. The assembly 50 is then drawn together with compression and retaining elements such as bolts, not shown, that extend through holes 63–70. The compression causes each spring member in the array 61 of the pressure plate 60 to displace each contact in the array 57 on the substrate 56 and thus to wipe the surfaces across each other of each of the contact pairs in the mating arrays 55 and 57 and then to retain each of the contact pairs under permanent compression in service.

Figure 8:
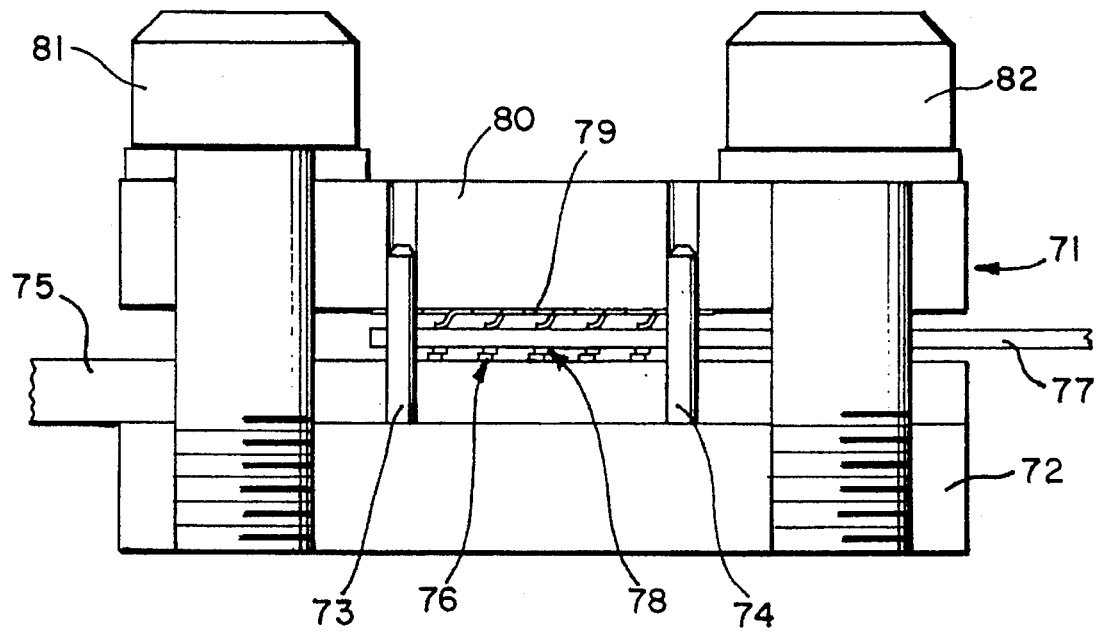
FIG. 8 is a schematic side view of a connector assembly, before compression, showing pad on pad connections between contacts on one side of a rigid substrate to a "flex tape".
Figure 9:
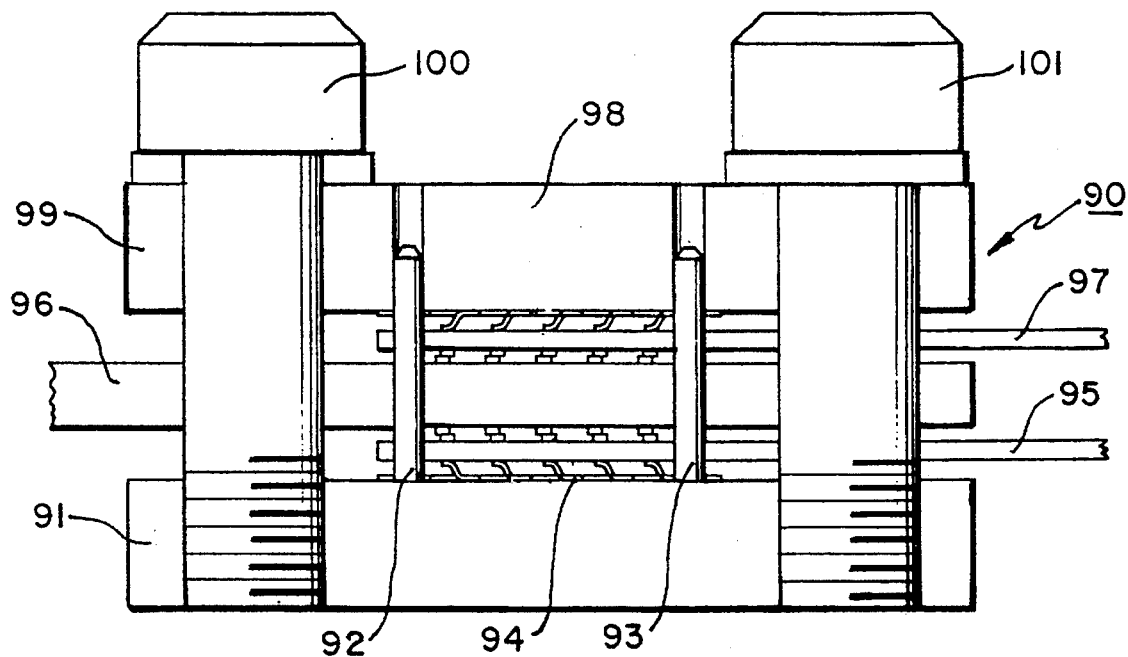
FIG. 9 is a schematic side view of a connector assembly, before compression, showing pad on pad connections between contacts on both sides of a rigid substrate to two separate "flex tapes".

The principles of a spring array assembly component contact spring member array in providing a contact displacement wiping and then permanent compression as, discussed connection with FIG. 7, is further illustrated in FIGS. 8 and 9, for single and double sided pad arrays.

Referring to FIG. 8, in a schematic side view, before compression, a connector assembly 71 has a rigid base 72 with vertical registration dowels 73 and 74. A rigid substrate 75 is positioned over the dowels 73 and 74 with an array of contacts 76, one row of which being visible in this view. The contacts of array 76 are on the side of the substrate 75 that is away from the base 72. A "flex tape" type substrate 77 is positioned over the dowels 73 and 74 with displacement clearance in the dowel accommodating openings and with the contacts of the array 78 in contact with the contacts of the array 76. In the "before compression" condition of this view the contact pad pairs are about half a pad width out of alignment. The spring array assembly component 79 with a spring member for each contact pair in arrays 76 and 78 is positioned with the dowels 73 and 74 through the registration holes therein, and with the side with the spring members protruding being in contact with the substrate 77. A rigid upper member 80 is positioned over the dowels 73 and 74, and compression and retention bolt type members 81 and 82 are used to draw the assembly 71 together. The drawing together of the assembly 71 causes the spring members in the pressure plate 79 to wipe the pad surfaces across each other of each contact pair bringing them into alignment and then hold each contact pair under permanent compressive force.

Referring to FIG. 9 a schematic side view, before compression, is shown of a connector assembly where there are arrays of contact pads on both sides of a rigid substrate that mate with an array of contact pads on each of two "flex tape" type substrates. The connector assembly 90 includes a rigid base member 91 with vertical registration dowels 92 and 93. A first spring array assembly component 94 is mounted with the dowels extending through the registration holes therein and with the side opposite to the spring members in contact with the base member 91. A first "flex tape" type substrate 95 is positioned with the dowels 92 and 93 through displacement clearance elongated holes, and with the side opposite to the contact pads in contact with the pressure plate 94 spring members. A rigid substrate 96 with contact pads on both sides, is positioned, entering the assembly 90 from the side opposite to the side entered by the substrate 95, with the dowels 92 and 93 extending through registration holes therein and with the contact pads on one side in contact with the contact pads of the substrate 95. A second "flex tape" type substrate 97 is positioned, entering the assembly 90 from the same side as the "flex tape" type substrate 95, with the contact pads in contact with the contact pads on the remaining side of the substrate 96, and with the dowels 92 and 93 through displacement clearance elongated holes. A second spring array assembly component 98 is mounted with the dowels 92 and 93 extending through the registration holes therein and with the side opposite to the spring members in contact with the side opposite to the contact pad side of the substrate 97. A rigid upper member 99 is positioned over the dowels 92 and 93 and the assembly is drawn together with bolt type members 100 and 101. The drawing together of the assembly causes the spring members of both spring array assembly components 94 and 98 to move the contact pads with respect to each other and become aligned, and then to retain all contact pad mating pairs under permanent compressive force.

What has been described is a pad on pad type contact for electronic apparatus wherein a spring member is provided, that by its shape and material, in the motion when the contact comes together wipes the mating pad surfaces across each other and then retains them under permanent compressive force and a technology of high density and high performance interwiring where array quantities of the spring member of the pad on pad contact of the invention is employed in unitary assembly elements in connection assemblies between both rigid and flexible wiring.

What is claimed is:

1. In a pad on pad type of electrical connection in electronic apparatus wherein the surfaces or an array of electrical contact pads on one substrate are brought into contact with the mating surfaces of a mating array of electrical contact pads on another substrate, an electrical connector comprising:

a base and upper rigid parallel support member assembly having compression means for urging and retaining said members toward each other, and having registration dowels extending from said base into said upper support member, a first substrate opening in a first side of said assembly for accommodating an end of a first conductor supporting substrate having an array of contact pads on one side thereof with the opposite side thereof on said base support member with said dowels passing through registration holes therein, a second substrate opening in a second and opposing side to said first side of said assembly, for accommodating an end of a second conductor supporting substrate having an array of contact pads on one side thereof in mating contact with the array of contact pads on said first substrate and positioned with said dowels passing through registration holes therein, a spring array component, said component having an array of spring elements, each spring element location in said array corresponding to the location of a pad in said array on one of said substrates, each said spring element having, an elongated spring portion with one end angularly attached to a common supporting portion of said array of spring elements and, a pad sized compression portion attached to the remaining end of said spring portion, and, said array of spring elements being positioned with said dowels through registration holes therein and with said spring members in contact with said second substrate.

2. The connector of claim 1 including each said compression portion of said array of spring elements being in friction contact with a surface of one of said substrates that is opposite to and at the location of each said electrical pad contact in said array.

3. The connector of claim 2 wherein each said spring element is made of spring steel.

4. The connector of claim 3 wherein each said friction contact is provided by an adhesive positioned between each said compression portion and said second substrate.

5. A pad on pad electrical connector comprising in combination, a first electrical connector pad positioned at a location on a first of first and second parallel sides of a first conductor supporting substrate, second electrical connector pad positioned on a first side of a second conductor supporting substrate having first and second parallel sides, said first pad being positioned for contact with said second pad, spring member, said spring member having a support portion, an elongated spring portion and a compression portion, said compression portion having a size of the order of said first and said second pads, said elongated spring portion having one end angularly attached to said support portion and having the remaining end angularly attached to said compression portion, said compression portion being positioned essentially in contact with said second side of said second conductor supporting substrate at essentially said second pad location, said compression portion of said spring member having a friction capability provided by an adhesive in contact with said second side of said second conductor supporting substrate, and, means providing force operable to move said first and second pads into contact with each other whereby said angularly attached elongated spring portion and said adhesive in contact with said second side of said second conductor supporting substrate produce a wiping movement of said connectorr pads across each other as said connector pads come into contact.

6. In a pad on pad type of electrical connection wherein the surface of an electrical contact pad on a first of first and second surfaces of a first substrate is brought into contact with the surface of a mating electrical pad contact on a second substrate, the improvement comprising:

a spring member, said spring member having, a supporting portion, an elongated spring portion with one end angularly a attached to said supporting portion and, a pad-sized compression portion angularly attached to the remaining end of said spring portion, said compression portion being in contact with said second surface of said first substrate and further having a friction capability provided by an adhesive located between said compression portion and said second surface of first said substrate that produces physical movement of said first substrate with respect to said second substrate.

7. In a pad on pad type of electrical connection in electronic apparatus wherein the surfaces of an array of electrical contact pads on one substrate are brought into contact with the mating surfaces of a mating array of electrical contact pads on another substrate, the improvement comprising:

a spring array assembly component, said component having an array of spring elements, each spring element location in said array corresponding to the location of a pad in said array on one of said substrates, each said spring element on said spring array assembly component having, an elongated spring portion with one end angularly a attached to a common supporting portion of said spring array assembly component and, a pad-sized compression portion attached to the remaining end of said spring portion, each said compression portion of each said spring element in said spring array assembly component being in friction contact provided by an adhesive in contact with a surface of one of said substrates that is opposite to end at the location of each said electrical pad contact in said array.

* * * * *